(12) United States Patent
Yang

(10) Patent No.: US 8,178,964 B2
(45) Date of Patent: May 15, 2012

(54) SEMICONDUCTOR DEVICE PACKAGE WITH DIE RECEIVING THROUGH-HOLE AND DUAL BUILD-UP LAYERS OVER BOTH SIDE-SURFACES FOR WLP AND METHOD OF THE SAME

(75) Inventor: Wen-Kun Yang, Hsin-Chu (TW)

(73) Assignee: Advanced Chip Engineering Technology, Inc., Hsinchu County (TW)

( * ) Notice: Subject to any disclaimer, the term of this patent is extended or adjusted under 35 U.S.C. 154(b) by 739 days.

(21) Appl. No.: 11/694,719

(22) Filed: Mar. 30, 2007

(65) Prior Publication Data

US 2008/0237879 A1 Oct. 2, 2008

(51) Int. Cl.
*H01L 23/04* (2006.01)
(52) U.S. Cl. .. 257/698; 257/700; 257/758; 257/E23.145
(58) Field of Classification Search ................. 257/712, 257/686, 706, 718, 719
See application file for complete search history.

(56) References Cited

U.S. PATENT DOCUMENTS

| | | | | |
|---|---|---|---|---|
| 6,127,634 | A * | 10/2000 | Higashiguchi et al. | 174/262 |
| 6,952,049 | B1 * | 10/2005 | Ogawa et al. | 257/700 |
| 2004/0106229 | A1 * | 6/2004 | Jiang et al. | 438/106 |

* cited by examiner

*Primary Examiner* — Marcos D. Pizarro
*Assistant Examiner* — Eva Yan Montalvo
(74) *Attorney, Agent, or Firm* — Kusner & Jaffe

(57) ABSTRACT

A structure of a semiconductor device package having a substrate with a die receiving through hole, a connecting through hole structure and a contact pad. A die is disposed within the die receiving through hole. A surrounding material is formed under the die and filled in the gap between the die and the sidewall of the die receiving though hole. Dielectric layers are formed on the both side surface of the die and the substrate. Re-distribution layers (RDL) are formed on the dielectric layers and coupled to the contact pads. Protection layers are formed over the RDLs.

12 Claims, 5 Drawing Sheets

SEMICONDUCTOR DEVICE PACKAGE WITH DIE RECEIVING THROUGH-HOLE AND DUAL BUILD-UP LAYERS OVER BOTH SIDE-SURFACES FOR WLP AND METHOD OF THE SAME

FIELD OF THE INVENTION

This invention relates to a structure of wafer level package (WLP), and more particularly to a fan-out wafer level package with dual build up layers formed over the both side-surfaces to improve the reliability and to reduce the device size.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip.

Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then the wafer is singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Though the advantages of WLP technique mentioned above, some issues still exist influencing the acceptance of WLP technique. For instance, the CTE difference (mismatching) between the materials of a structure of WLP and the mother board (PCB) becomes another critical factor to mechanical instability of the structure. A package scheme disclosed by U.S. Pat. No. 6,271,469 suffers the CTE mismatching issue. It is because the prior art uses silicon die encapsulated by molding compound. As known, the CTE of silicon material is 2.3, but the CTE of molding compound is around 40-80. The arrangement causes chip location be shifted during process due to the curing temperature of compound and dielectric layers materials are higher and the interconnecting pads will be shifted that will causes yield and performance problem. It is difficult to return the original location during temperature cycling (it caused by the epoxy resin property if the curing Temp near/over the Tg). It means that the prior structure package can not be processed by large size, and it causes higher manufacturing cost.

Further, some technical involves the usage of die that directly formed on the upper surface of the substrate. As known, the pads of the semiconductor die will be redistributed through redistribution processes involving a redistribution layer (RDL) into a plurality of metal pads in an area array type. The build up layer will increase the size of the package. Therefore, the thickness of the package is increased. This may conflict with the demand of reducing the size of a chip.

Further, the prior art suffers complicated process to form the "Panel" type package. It needs the mold tool for encapsulation and the injection of mold material. It is unlikely to control the surface of die and compound at same level due to warp after heat curing the compound, the CMP process may be needed to polish the uneven surface. The cost is therefore increased.

SUMMARY OF THE INVENTION

For the aforementioned, the present invention provides a fan-out wafer level packaging (FO-WLP) structure with good CTE matching performance and shrinkage size to overcome the aforementioned problem and also provide the better board level reliability test of temperature cycling.

The object of the present invention is to provide a fan-out WLP with excellent CTE matching performance and shrinkage size.

The further object of the present invention is to provide a fan-out WLP with a substrate having die receiving through-hole for improving the reliability and shrinking the device size.

The further object of the present invention is to provide a fan-out WLP having dual build-up layers for increasing the number of fan-out traces. Therefore, the package of the present invention can improve the ability of heat dissipation through double build-up layer to redistribute the pitch of pads and dimension of conductive trace.

The present invention discloses a structure of package comprising: a substrate with a die receiving through hole, a connecting through hole structure and a first contact pad; a die is disposed within the die receiving through hole; a surrounding material is formed under the die and filled in the gap between the die and sidewall of the die receiving though hole, wherein the lower surface of the surrounding material is keeping the same level as the substrate; a first re-distribution layer (RDL) is formed above the active surface of the die and the substrate and coupled to the first contact pad; a second contact pad is formed at the lower surface of the substrate and under the connecting through hole structure. A second re-distribution layer is formed under the substrate and the surrounding material and coupled to the second contact pad.

The material of the substrate includes epoxy type FR5, FR4, BT, silicon, PCB (print circuit board) material, glass or ceramic. Alternatively, the material of the substrate includes alloy or metal; it prefers that the CTE (Coefficient of Thermal Expansion) of the substrate is close to the CTE of mother board (PCB) having CTE around 16 to 20. The material of the dielectric layer includes an elastic dielectric layer, a photosensitive layer, a silicone dielectric based layer, a siloxane polymer (SINR) layer, a polyimides (PI) layer or silicone resin layer.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying Claims.

The present invention discloses a structure of fan-out WLP utilizing a substrate having predetermined terminal contact metal pads 104 formed thereon and a pre-formed through hole 106 formed into the substrate 102. A die is disposed within the die receiving through hole of the substrate and attached on core paste material, for example, an elastic core paste material is filled into the space between die edge and side wall of die receiving through hole of the substrate or under the die. A photosensitive material is coated over the die and the pre-formed substrate (includes the core paste area), and forming the photosensitive material at lower surface thereof. Preferably, the material of the photosensitive material is formed of elastic material.

Figure 1:
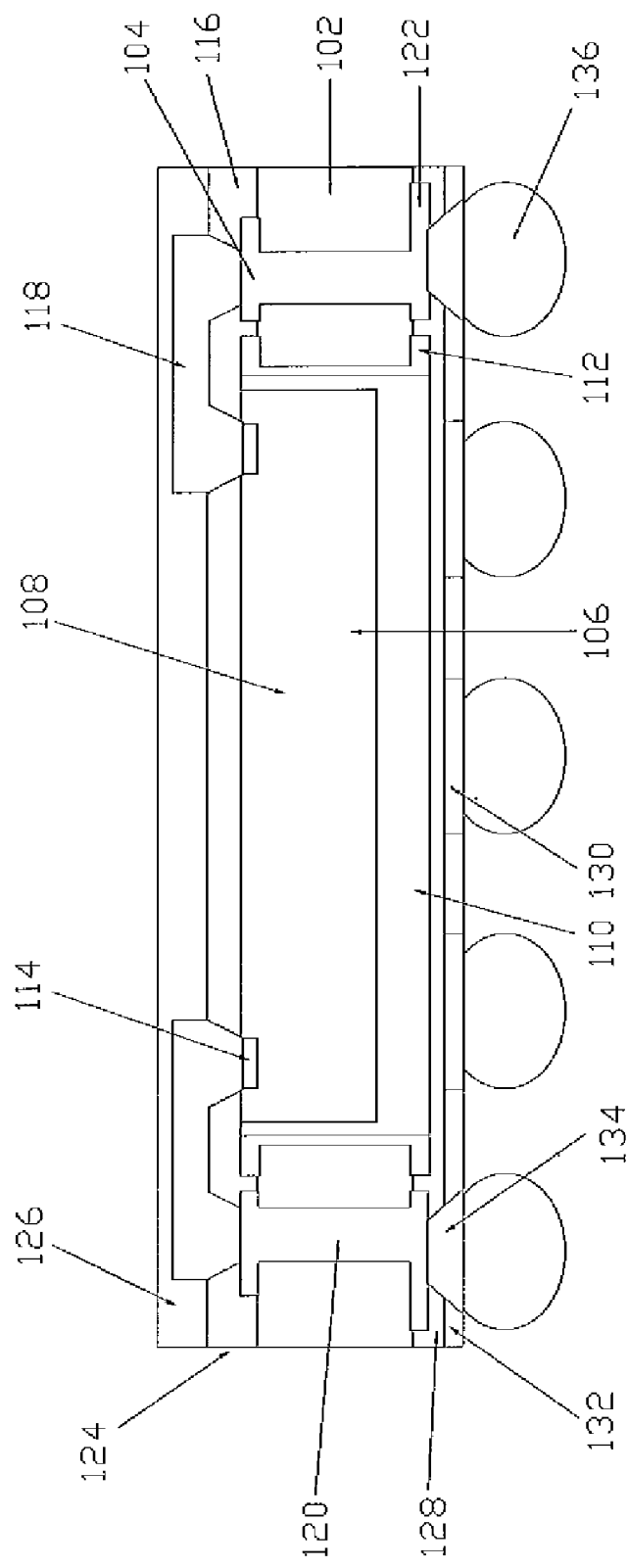
FIG. 1 illustrates a cross-sectional view of a structure of fan-out WLP according to the present invention.

FIG. 1 illustrates a cross-sectional view of Fan-Out Wafer Level Package (FO-WLP) in accordance with one embodiment of the present invention. As shown in the FIG. 1, the structure of FO-WLP includes a substrate 102 having a first terminal contact conductive pads 104 (for organic substrate) and die receiving through holes 106 formed therein to receive a die 108. The die receiving through holes 106 is formed from the upper surface of the substrate through the substrate to the lower surface. The through hole 106 is pre-formed within the substrate 102. The core paste material 110 is printed/coated/dispensing under the lower surface of the die 108, thereby sealing the die 108. The core paste 110 is also refilled within the space (gap) between the die edge 108 and the sidewalls of the through holes 108. A conductive (metal) layer 112 is coated on the sidewall of the die receiving through holes 106 as optional process to improve the adhesion between core paste and substrate.

The die 108 is disposed within the die receiving through holes 106 on the core paste material 110. As know, contact pads (Bonding pads) 114 are formed on the die 108 in active surface site. A photosensitive layer or dielectric layer 116 is formed over the die 108 and the upper surface of substrate 102. Pluralities of openings are formed within the dielectric layer 116 through the lithography process or exposure and develop procedure. The pluralities of openings are aligned to the contact pads (or I/O pads) 114 and the first terminal contact conductive pads 104 on the upper surface of the substrate 102, respectively. The RDL (redistribution layer) 118, also referred to as conductive trace 118, is formed on the dielectric layer 116 by removing selected portions of metal layer formed over the layer 116, wherein the RDL 118 keeps electrically connected with the die 108 through the I/O pads 114 and the first terminal contact conductive pads 104. A protection layer 126 is employed to cover the RDL 118. The substrate 102 further comprises connecting through holes 120 formed within the substrate 102. The first terminal contact metal pads 104 are formed over the connecting through holes 120. The conductive material is re-filled into the connecting through holes 120 for electrical connection. A scribe line 124 is defined between the package units for separating each unit, optionally, there is no dielectric layer over the scribe line.

Second terminal contact conductive pads 122 are located at the lower surface of the substrate 102 and under the connecting through holes 120 and connected to the first terminal contact conductive pads 104 of the substrate 102. A photosensitive layer or dielectric layer 128 is formed over the second terminal contact conductive pads 122, and at the lower surface of the core paste material 110 and substrate 102. It may be sued the laser to open the core paste materials 110 under the die (die back site) if it is need to connect the back site of said die for grounding or heat dissipation. Pluralities of openings are formed within the dielectric layer 128 through the lithography process or exposure and develop procedure. The pluralities of openings are aligned to the second terminal contact conductive pads 122 on the upper surface of the substrate 102 to form contact via, respectively. The RDL (conductive trace) 130 is formed on the dielectric layer 128 by removing selected portions of metal layer formed over the layer 128. Finally, a protection layer 132 is formed to cover the RDL 130, and pluralities of openings are formed on protection layer 132 to form UBM (Under Ball Metal) 134. Conductive balls 136 are formed on the UBM 134.

The dielectric layers 116 and 126, and the core paste material 110 act as buffer area that absorbs the thermal mechanical stress between the die 108 and substrate 102 during temperature cycling due to the dielectric layers have elastic property. Additionally, the dielectric layers 128 and 132 further aid in absorbing the thermal mechanical stress. The aforementioned structure constructs a BGA type package.

Preferably, the material of the substrate 102 is organic substrate likes epoxy type FR5, BT, PCB with defined through holes or Cu metal with pre-etching circuit. Preferably, the CTE is the same as the one of the mother board (PCB). Preferably, the organic substrate with high Glass transition temperature (Tg) are epoxy type FR5 or BT (Bismaleimide triazine) type substrate. The Cu metal (CTE around 16) can be used also. The glass, ceramic, silicon can be used as the substrate. The elastic core paste is formed of silicone rubber elastic materials.

It is because that the CTE (X/Y direction) of the epoxy type organic substrate (FR5/BT) is around 16 and the CTE in Z direction is about 60, and the CTE of the tool for chip redistribution can be selected to close the CTE of substrate, then, it can reduce the die shift issue during the temperature curing of core paste materials. The FR5/BT is unlikely to return to original location after the temperature cycling (the temperature is close to Glass transition temperature Tg) if using the materials with CTE mismatching that causes the die shift in panel form during the WLP process which needs several high temperature process, for instant, the curing temperature of dielectric layers and core paste curing etc.

The substrate could be round type such as wafer type, the diameter could be 200, 300 mm or higher. It could be employed for rectangular type such as panel form. The substrate 102 is pre-formed with die receiving through holes 106. The scribe line 124 is defined between the units for separating each unit. Please refer to FIG. 2, it shows that the substrate 102 includes a plurality of pre-formed die receiving through hole 106 and the connecting through holes 120. Conductive material is re-filled into the connecting through holes 120, thereby constructing the connecting through-hole structures.

In one embodiment of the present invention, the dielectric layers 116, 128 or 132 are preferably an elastic dielectric material which is made by silicone dielectric based materials comprising siloxane polymers (SINR), Dow Corning WL5000 series, and the combination thereof. In another embodiment, the dielectric layers are made by a material comprising, polyimides (PI) or silicone resin. Preferably, they are photosensitive layers for simple process.

In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layers depend on the stress accumulated in the RDL/dielectric layer interface during temperature cycling test.

Figure 3:
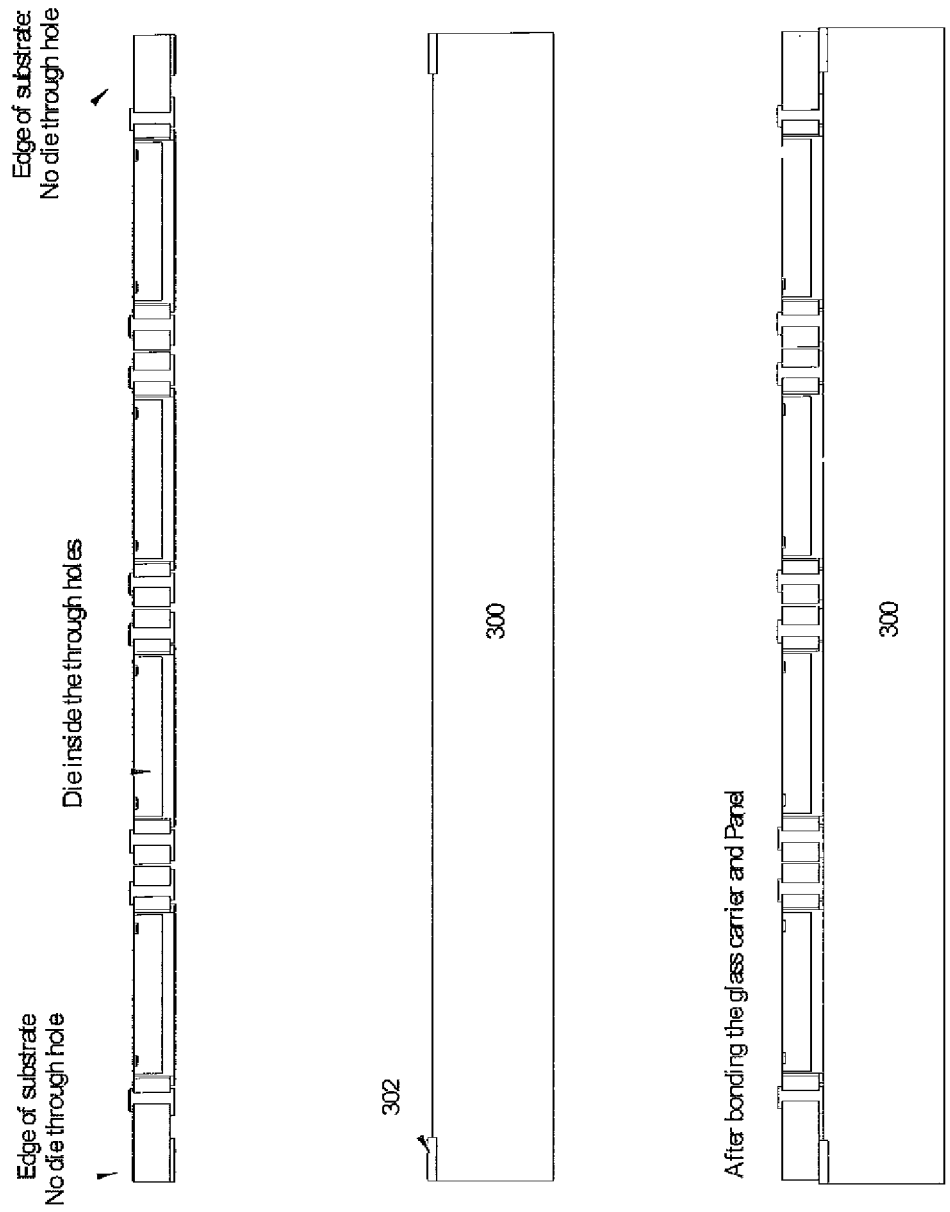
FIG. 3 illustrates a cross-sectional view of the combination of the substrate and the glass carrier according to the present invention.

FIG. 3 illustrates the tool 300 for BT/FR5 carrier (it maybe Glass, Silicon, Ceramic or metal/Alloy) and the substrate 102. Adhesion materials 302 such as UV curing type material are formed at the periphery area of the tool 300. In one case, the tool could be made of BT/FR5 with the shape of panel form. The connecting through holes structures will not be formed at the edge of the substrate. The lower portion of FIG. 3 illustrates the combination of the tool 300 and the substrate 102. The panel will be adhesion with the BT/FR5 carrier, it will stick and hold the panel during process. The thickness of carrier could be around 400 um to 600 um.

Figure 4:
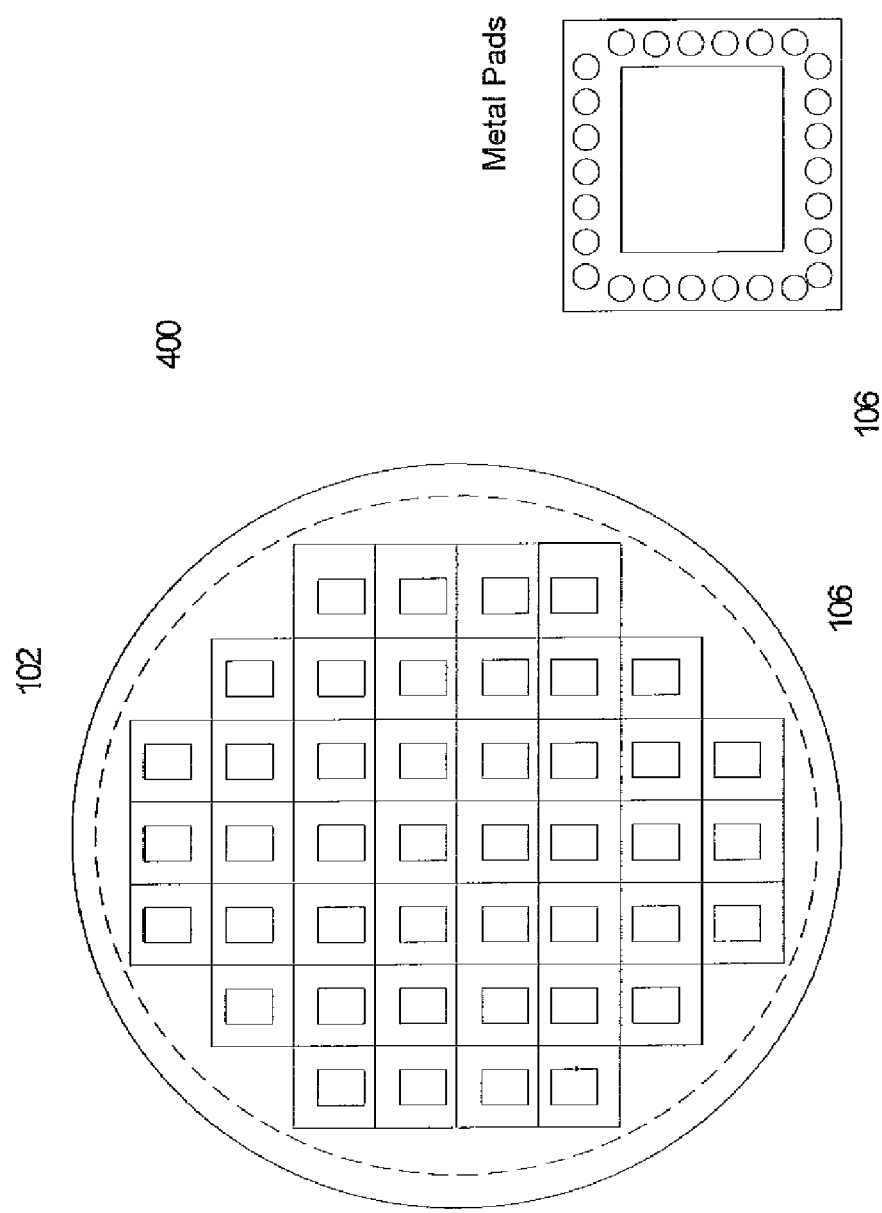
FIG. 4 illustrates a top view of the substrate according to the present invention.

FIG. 4 illustrates the top view of the substrate 102 having die receiving through holes 106. The edge area 400 of substrate 102 does not have the die receiving through holes 106, it is employed for sticking the BT/FR5 carrier during WLP process. After the WLP process is completed, the substrate 102 will be cut along the dot line from the glass carrier, or cutting the adhesion materials to separate the panel and carrier, it means that the inside area of dot line will be processed by the sawing process for package singulation.

Figure 5:
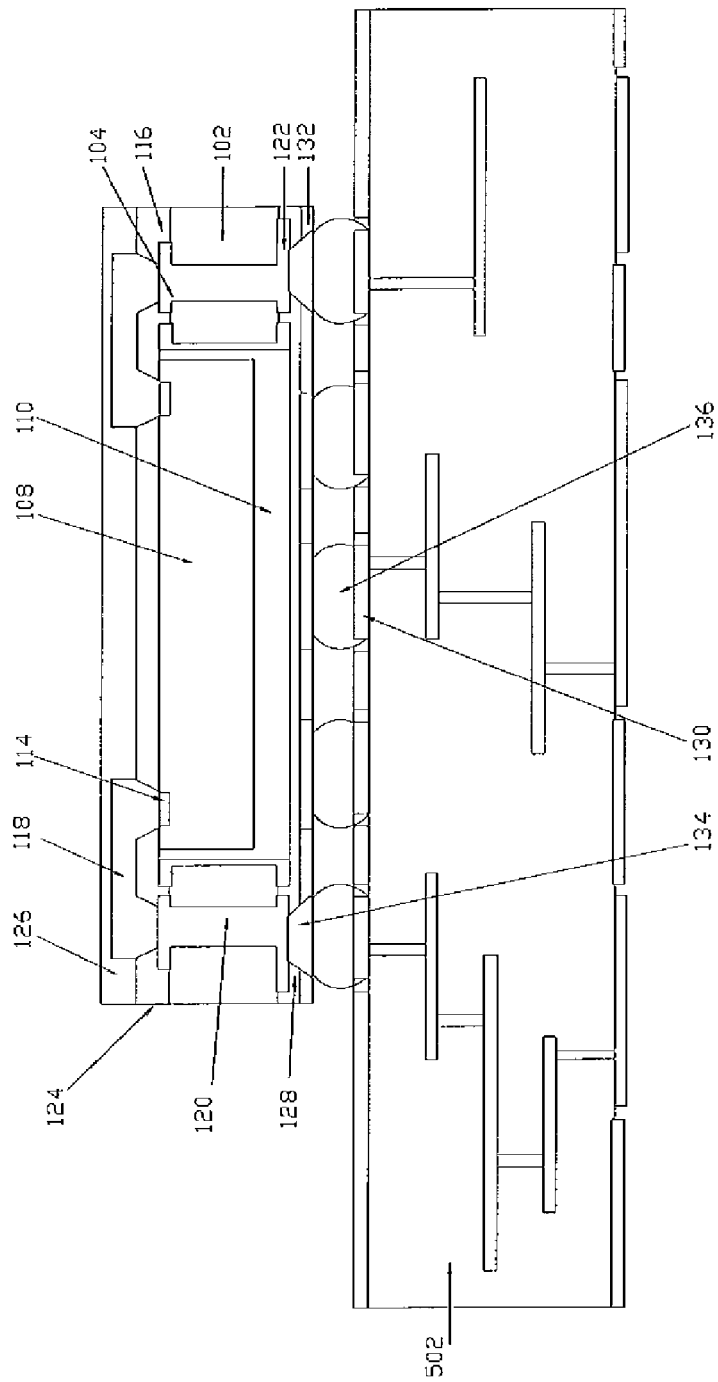
FIG. 5 illustrates a view of the semiconductor device package on board level temperature cycling test according to the present invention.

Please refer to FIG. 5, it illustrates the major portions that associate with the CTE issue. The silicon die 108 (CTE is ~2.3) is packaged inside the package. FR5 or BT organic epoxy type material (CTE~16) is employed as the substrate 102 and its CTE is the same as the PCB or Mother Board 502. The space (gap) between the die 108 and the substrate 102 is filled with filling material (prefer the elastic core paste) to absorb the thermal mechanical stress due to CTE mismatching (between die and the epoxy type FR5/BT). Further, the dielectric layers 116 include elastic materials to absorb the stress between the die I/O pads and the PCB 502. The RDL metal is Cu/Au materials and the CTE is around 16 which is the same as the PCB 502 and organic substrate, and the UBM 134 of contact bumps 136 is located under the terminal contact metal pads 104 of substrate 102 (some of them). The metal land of PCB 502 is Cu composition metal, the CTE of Cu is around 16 that is match to the one of PCB. From the description above, the present invention may provide excellent CTE (fully matching in X/Y direction) solution for the FO-WLP.

Apparently, CTE matching issue under the build up layers (PCB and substrate) is solved by the present scheme and it provides better reliability (no thermal stress in X/Y directions for terminal pads (solder balls/bumps) on the substrate during on board level condition) and the elastic dielectric layers are employed to absorb the Z direction stress. The space (gap) between chip 108 edge and sidewall of through holes 120 of substrate 102 can be used to fill the elastic dielectric materials to absorb the mechanical/thermal stress.

In one embodiment of the invention, the material of the RDL comprises Ti/Cu/Au alloy or Ti/Cu/Ni/Au alloy; the thickness of the RDL is the range of 2 um and 15 um. The Ti/Cu alloy is formed by sputtering technique also as seed metal layers, and the Cu/Au or Cu/Ni/Au alloy is formed by electroplating; exploiting the electro-plating process to form the RDL can make the RDL thick enough and better mechanical properties to withstand CTE mismatching during temperature cycling. The metal pads can be Al or Cu or combination thereof. If the structure of FO-WLP utilizes SINR as the elastic dielectric layer and Cu as the RDL, according the stress analysis not shown here, the stress accumulated in the RDL/dielectric layer interface is reduced.

Figure 2:
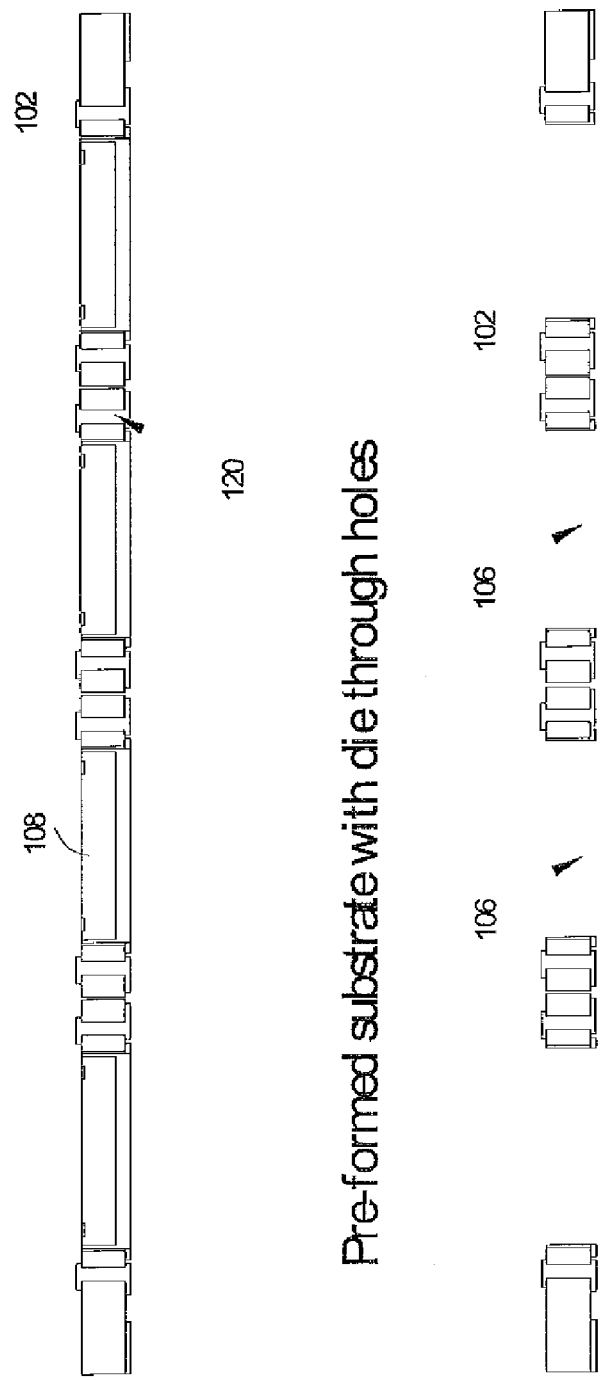
FIG. 2 illustrates a cross-sectional view of the substrate according to the present invention.

As shown in FIG. 1-2, the RDLs fan out from the die 108 and they communicate toward the second terminal pads 122 and UBM 134 downwardly. It is different from the prior art technology, the die 108 is received within the pre-formed die receiving through hole 106 of the substrate 102, thereby reducing the thickness of the package. The prior art violates the rule to reduce the die package thickness. The package of the present invention will be thinner than the prior art. Further, the substrate is pre-prepared before package. The through hole 106 is pre-determined. Thus, the throughput will be improved than ever. The present invention discloses a fan-out WLP with reduced thickness and good CTE matching performance.

The present invention includes preparing a substrate (preferably organic substrate FR4/FR5/BT) and contact metal pads are formed on top and bottom surface through the connecting through hole. The die receiving through hole is formed with the size larger than die size plus >around 100 um/side. The depth is the same (or about 25 um thick than) with the thickness of dice thickness.

The next step is lapping the wafer by back-lapping to desired thickness. The wafer is introduced to dicing procedure to separate the dice.

Thereafter, process for the present invention includes providing a die redistribution (alignment) tool with alignment pattern formed thereon. Then, the patterned glues is printed on the tool (be used for sticking the surface of dice), followed by using pick and place fine alignment system with flip chip function to redistribute the desired dies on the tool with desired pitch. The patterned glues will stick the chips (active surface side) on the tool. Subsequently, the substrate (with die receiving through holes) is bound on the tool and followed by printing elastic core paste material on the space (gap) between die and side walls of through holes of the (FR5/BT) substrate and the die back side. It is preferred to keep the surface of the core paste and the substrate at the same level. Next, the curing process is used to cure the core paste material and bonding the carrier by UV or thermal curing. The panel bonder is used to bond the carrier on to the substrate and die back side. Vacuum bonding is performed, followed by separating the tool from the panel wafer.

Once the die is redistributed on the substrate (panel base), then, a clean up procedure is performed to clean the dice surface by wet and/or dry clean. Next step is to coat the dielectric materials on the surface of panel. Subsequently, lithography process is performed to open via (contact metal pads) and Al bonding pads or the scribe line (optional). Plasma clean step is then executed to clean the surface of via holes and Al bonding pads. Next step is to sputter Ti/Cu as seed metal layers, and then Photo Resistor (PR) is coated over the dielectric layer and seed metal layers for forming the patterns of redistributed metal layers (RDL). Then, the electro plating is processed to form Cu/Au or Cu/Ni/Au as the RDL metal, followed by stripping the PR and metal wet etching to form the RDL metal trace. Subsequently, the next step is to coat or print the top dielectric layer and to open the contact metal via (optional for final testing) or to open the scribe line (optional). It can repeat the procedures to form multi-RDL layers and dielectric layer, such as seed layer, PR, E-plating or strip/etching.

Thereafter, it is to bond the carrier 300 on the front surface of the panel after separating the carrier 300 from the back surface thereof. A clean up procedure is performed to clean the back side of the panel by wet and/or dry clean, optionally, to laser open the back site of die (if it is needed). Next step is to coat the dielectric materials on the back surface of panel to form the dielectric layer. Subsequently, lithography process is performed to open via (contact metal pads) and/or the partial of back site of die. Next step is to sputter Ti/Cu as seed metal layers on the dielectric layer, and then Photo Resistor (PR) is coated over the dielectric layer and seed metal layers for forming the patterns of redistributed metal layers (RDL). Then, the electro plating is processed to form Cu/Au or Cu/Ni/Au as the RDL metal, followed by stripping the PR and metal wet etching to form the RDL metal trace. Subsequently, the next step is to coat or print the top dielectric layer and to open the contact metal pads to form UBM.

After the ball placement or solder paste printing, the heat re-flow procedure is performed to re-flow on the ball side (for BGA type). The testing is executed. Panel wafer level final testing is performed by using vertical or epoxy probe card to contact the solder balls or bumps. After the testing, the substrate is sawed to singular the package into individual units. Then, the packages are respectively picked and placed the package on the tray or tape and reel.

The advantages of the present inventions are:

The process is simple for forming Panel wafer type and is easy to control the roughness of panel surface. The thickness of panel is easy to be controlled and die shift issue will be eliminated during process. The injection mold tool is omitted, CMP polish process will not be introduced either, and no warp result from the process. The panel wafer is easy to be processed by wafer level packaging process. CTE match under the build up layers (PCB and substrate) has better reliability that no thermal stress results in X/Y direction on board and by using elastic dielectric layers to absorb the stress from Z direction. Single material is sawed during singulation.

The substrate is pre-prepared with pre-form through holes, inter-connecting through holes and terminal contact metal pads (for organic substrate); the size of die receiving through hole is equal to die size plus around >100 um per/side; it can be used as stress buffer releasing area by filling the elastic core paste materials to absorb the thermal stress due to the CTE between silicon die and substrate (FR5/BT)) is difference, additionally, it can fill the elastic dielectric materials to the gap between die edge and side wall of the substrate to absorb the mechanical or thermal stress due to the CTE mismatch. The packaging throughput will be increased (manufacturing cycle time was reduced) due to apply the simple build up layers on top the surface of die and bottom site. The terminal pads are formed on the opposite side of the dice active surface.

The dice placement process is the same as the current process. Elastic core paste (resin, epoxy compound, silicone rubber, etc.) is refilled the space between the dice edge and the sidewall of the through holes for thermal stress releasing buffer in the present invention, then, vacuum heat curing is applied. CTE mismatching issue is overcome during panel form process (using the BT/FR5 carrier with same CTE of substrate). The deepness between the die and substrate is about 25 um, and the dielectric layer and RDL are formed on both the upper and lower surface of the panel. Only silicone dielectric material (preferably SINR) is coated on the active surface and the substrate (preferably FR45 or BT) surface. The contact pads are opened by using photo mask process only due to the dielectric layer (SINR) is photosensitive layer for opening the contacting open. The die and substrate be bonded together with carrier. The reliability for both package and board level is better than ever, especially, for the board level temperature cycling test, it was due to the CTE of substrate and PCB mother board are identical, hence, no thermal mechanical stress be applied on the solder bumps/balls; and thickness of the package with protection is extremely thin which is less 200 um. The cost is low and the process is simple. It is easy to form the multi-chips package as well.

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. A structure of semiconductor device package comprising:
    a substrate with a die receiving through hole, a connecting through hole structure and a first contact pad;
    a die disposed within said die receiving through hole;
    a core paste formed under said die and filled in the gap between said die and sidewall of said die receiving through hole;
    a first re-distribution layer (RDL) formed above said die and said substrate and coupled to said first contact pad and wherein said first re-distribution layer fans out from said die;
    a first dielectric layer formed on said die and said substrate, wherein said first RDL formed on said first dielectric layer;
    a second contact pad formed at the lower surface of said substrate; and
    a second re-distribution layer (RDL) formed under said substrate and coupled to said second contact pad;
    wherein the material of said first RDL or said second RDL comprises Ti/Cu/Au alloy or Ti/Cu/Ni/Au alloy.

2. The structure of claim 1, further comprising a second dielectric layer formed at lower surface of said surrounding material and said substrate, wherein said second RDL formed on second dielectric layer.

3. The structure of claim 1, further comprising a protection layer formed over said first RDL or said second RDL.

4. The structure of claim 2, wherein said second dielectric layer includes an elastic dielectric layer, a photosensitive layer, a silicone dielectric based layer, a siloxane polymer (SINR) layer, a polyimides (PI) layer or silicone resin layer.

5. The structure of claim 1, further comprising conductive bumps coupled to said second contact pad.

6. The structure of claim 1, wherein the material of said first dielectric layer and said second dielectric layer comprises an elastic dielectric layer.

7. The structure of claim 1, wherein the material of said substrate includes epoxy type FR5 or FR4.

8. The structure of claim 1, wherein the material of said substrate includes bismaleimide triazine (BT), silicon, PCB (printed circuit board) material, glass or ceramic.

9. The structure of claim 1, wherein the material of said substrate includes alloy or metal.

10. The structure of claim 1, wherein said core paste includes elastic core paste material.

11. The structure of claim 1, wherein said first dielectric layer includes an elastic dielectric layer, a photosensitive layer, a silicone dielectric based layer, a siloxane polymer (SINR) layer, a polyimides (PI) layer or silicone resin layer.

12. The structure of claim 1, wherein said semiconductor device package is formed on a printed circuit board having traces.

* * * * *